(12) United States Patent
Chidambarrao et al.

(10) Patent No.: US 7,791,144 B2
(45) Date of Patent: Sep. 7, 2010

(54) HIGH PERFORMANCE STRESS-ENHANCE MOSFET AND METHOD OF MANUFACTURE

(75) Inventors: Dureseti Chidambarrao, Weston, CT (US); Ricardo A. Donaton, Cortlandt Manor, NY (US); William K. Henson, Peekskill, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/506,770

(22) Filed: Jul. 21, 2009

(65) Prior Publication Data

US 2010/0013024 A1    Jan. 21, 2010

Related U.S. Application Data

(62) Division of application No. 11/380,689, filed on Apr. 28, 2006, now Pat. No. 7,608,489.

(51) Int. Cl.
*H01L 21/8238* (2006.01)
*H01L 27/092* (2006.01)

(52) U.S. Cl. .............. 257/369; 257/E27.062; 257/E21.634; 438/199; 438/938

(58) Field of Classification Search ............ 257/369, 257/E21.634, E29.039, E27.062; 438/154, 438/199, 229, 218, 275, 299, 303, 938
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |

(Continued)

FOREIGN PATENT DOCUMENTS

JP     64-76755     3/1989

(Continued)

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Victor A Mandala
*Assistant Examiner*—Scott Stowe
(74) *Attorney, Agent, or Firm*—Steven Capella; Roberts Mlotkowski Safran & Cole, P.C.

(57) ABSTRACT

The invention relates to a semiconductor structure and method of manufacturing and more particularly to a CMOS device with a stress inducing material embedded in both gates and also in the source/drain of the PFET and varying thickness of the PFET and NFET channel. In one embodiment, the structure enhances the device performance by varying the thickness of the top Silicon layer respective to the NFET or the PFET.

18 Claims, 11 Drawing Sheets

U.S. PATENT DOCUMENTS

| | | | |
|---|---|---|---|
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozakan et al. |
| 6,531,740 | B2 | 3/2003 | Bosco et al. |
| 6,621,392 | B1 | 9/2003 | Volant et al. |
| 6,635,506 | B2 | 10/2003 | Volant et al. |
| 6,717,216 | B1 | 4/2004 | Doris et al. |
| 6,825,529 | B2 | 11/2004 | Chidambarrao et al. |
| 6,831,292 | B2 | 12/2004 | Currie et al. |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 7,217,608 | B1 | 5/2007 | Xiang |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2003/0227013 | A1* | 12/2003 | Currie et al. .................. 257/19 |
| 2004/0113174 | A1 | 6/2004 | Chidambarrao et al. |
| 2004/0113217 | A1 | 6/2004 | Chidambarrao et al. |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0082634 | A1 | 4/2005 | Doris et al. |
| 2005/0093030 | A1 | 5/2005 | Doris et al. |
| 2005/0098829 | A1 | 5/2005 | Doris et al. |
| 2005/0106799 | A1 | 5/2005 | Doris et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0221550 | A1* | 10/2005 | Fitzgerald .................. 438/199 |
| 2005/0236668 | A1 | 10/2005 | Zhu et al. |
| 2005/0245017 | A1 | 11/2005 | Belyanski et al. |
| 2005/0280051 | A1 | 12/2005 | Chidambarrao et al. |
| 2005/0282325 | A1 | 12/2005 | Belyanski et al. |
| 2006/0027868 | A1 | 2/2006 | Doris et al. |
| 2006/0057787 | A1 | 3/2006 | Doris et al. |
| 2006/0060925 | A1 | 3/2006 | Doris et al. |
| 2006/0163672 | A1 | 7/2006 | Wang et al. |
| 2006/0228851 | A1 | 10/2006 | Sadaka et al. |
| 2006/0286736 | A1 | 12/2006 | Orlowski et al. |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., Temperature Dependence of Emitter-Base Reverse Stress Degradation and its Mechanism Analyzed by MOS Structures. Paper 6.2, pp. 140-143, IEEE 1989.

C.J. Huang et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBT's Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al. "Annealing of Degraded npn-Transistors-Mechanisms and Modeling." IEEE Transactions on Electron Devices, vol. 41, No. 4 Apr. 1994, pp. 533-538.

B. Doyle, et al., "Recovery of Hot-Carrier Damage in Reoxidezed Nitrided Oxide MOSFETs." IEEE Electron Device Letters, vol. 13, No. 1, Jan. 1992, pp. 38-40.

H.S. Momose, et al. "Analysis of the Temperature Dependece of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Pmax/Ft=350/300 Ghz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramarian S. Iyer, et al., "Heterojuction Bipolar Transistors Using Si—Ge Alloys" IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

* cited by examiner

HIGH PERFORMANCE STRESS-ENHANCE MOSFET AND METHOD OF MANUFACTURE

CROSS REFERENCE TO RELATED APPLICATION

This application is a divisional application of U.S. patent application Ser. No. 11/380,689 filed on Apr. 28, 2006, the contents of which are incorporated herein by reference in their entirety.

FIELD OF THE INVENTION

The invention generally related to a semiconductor device and method of manufacture and, more particularly, to a semiconductor device and method of manufacture which imposes tensile and compressive stresses in the device during fabrication.

BACKGROUND DESCRIPTION

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type device (e.g., NFETs) and/or p-type devices (e.g., PFETs). However, the same stress component, either tensile stress or compressive stress, discriminatively affects the characteristics of an n-type device and p-type device.

For example, it has been known that a device exhibits better performance characteristics when formed on a silicon layer (or cap) that is epitaxially grown on a SiGe layer that has relaxed on top of the silicon substrate. In this system, the silicon cap is subject to biaxial tensile strain. When epitaxially grown on silicon, an unrelaxed SiGe layer will have a lattice constant that conforms to that of the silicon substrate. Upon relaxation (through a high temperature process for example) the SiGe lattice constants approaches that of that of its intrinsic lattice constant which is larger than that of silicon. A fully relaxed SiGe layer has a lattice constant close to its intrinsic value. When the silicon is epitaxially grown thereon, the silicon layer conforms to the larger lattice constant of the relaxed SiGe layer and this applies physical biaxial stress (e.g., expansion) to the silicon layer being formed thereon. This physical stress applied to the silicon layer is beneficial to the devices (e.g., CMOS devices) formed thereon because the expanded silicon layer increases n-type performance while a higher Ge content in the SiGe layer improves p-type performance.

In order to maximize the performance of both NFETs and PFETs within integrated circuit (IC) chips, the stress components should be engineered and applied differently for NFETs and PFETs. That is, because the type of stress which is beneficial for the performance of an NFET is generally disadvantageous for the performance of the PFET. More particularly, when a device is in tension (e.g., in the direction of current flow in planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contains a first isolation material which applies a first type of mechanical stress on the NFET device in a longitudinal direction (e.g., parallel to the direction of current flow) and in a transverse direction (e.g., perpendicular to the direction of current flow). Further a first isolation region and a second isolation region are provided for the PFET and each of these isolation regions applies a unique mechanical stress on the PFET device in the transverse and longitudinal directions.

Alternatively, liners on gate sidewalls have been proposed to selectively induce the appropriate stresses induce the appropriate stresses in the channels of the FET devices (see, Ootsuka et al., IEDM 2000, p. 575, for example). By providing liners the appropriate stress is applied closer to the device than the stress applied as a result of the trench isolation fill technique.

While these methods do provide structures that have tensile stresses being applied to the NFET device and compressive stresses being applied along the longitudinal direction of the PFET device, they may require additional materials and/or more complex processing and thus, resulting in higher costs. Further, the level of stress that can be applied in these situations is typically moderate (i.e., on the order of 100s MPa). Therefore, it is desired to provide more cost-effective and simplified methods for creating large tensile and compressive stresses in the channels NFET and PFET, respectively.

SUMMARY OF THE INVENTION

In a first aspect of the invention, a method of manufacturing a semiconductor structure includes forming, simultaneously, a layered structure with an underlying stress inducing material, in a p-type field-effect-transistor (PFET) channel region and a n-type field-effect-transistor (NFET) channel region. The method further includes protecting the NFET channel region while forming a layer over the underlying stress inducing material of the PFET channel region to reduce the stress effect in the PFET channel region. An island is etched in the NFET channel region and the PFET channel region, creating a higher resultant stress component in the NFET channel region. A stress inducing material is formed in etched portions of the PFET channel region creating an opposite stress component in the PFET channel region than in the NFET channel region.

In another aspect of the invention, a method of manufacturing a semiconductor structure is provided. The method includes forming a stress-inducing layer on a substrate in an NFET region and a PFET region and forming a top layer over the stress-inducing layer in the NFET region and the PFET region. The top layer is of a different thickness in the NFET region and the PFET region. Trenches are etched into sides of the PFET region and the NFET region. Upon etching, the elastic edge relaxation of the stress-inducing layer creates a tensile stress in the channel region. The thin top layer results in higher tensile stress in the NFET channel region and the thick top layer results in very small tensile stress in the PFET channel region. The trenches are filled with a first material for the NFET region and a second material for the PFET region. The second material creates a compressive stress in the PFET region.

Furthermore, in another aspect of the invention, a semiconductor structure is provided that includes a PFET and NFET channel formed in a substrate such as, for example, a Si layer. The PFET and NFET devices have a layered structure of the same materials in the channel region. A top layer of the same materials in the PFET channel region is thicker than a top layer of the NFET channel region. Trenches of the PFET channel region and the NFET channel region is different.

DETAILED DESCRIPTION OF EMBODIMENTS OF THE INVENTION

This invention is directed to a semiconductor device and method of manufacture, which provides tensile stress in the NFET channel and compressive stress in the PFET channel of the CMOS. In embodiments of the invention, the stresses formed in the NFET and PFET channel can be achieved on a same substrate using similar processing steps, thus reducing the overall material costs and time for producing such device. In embodiments, channels are formed in the silicon layer in the area of the formation of the NFETs and PFETs. The channels of the devices are then separately and selectively treated such that while one device is covered, the other device can be etched and filled to obtain desired properties. By applying these techniques, tensile or compressive forces result in the overlying epitaxially grown layers in the channels of the NFETs and PFETs, respectively. In one embodiment, the overlying silicon layer of the PFETs are allowed to grow thicker than its homologous layer of the NFET. This fabrication process of the invention results in devices with improved channel properties.

Figure 1A:
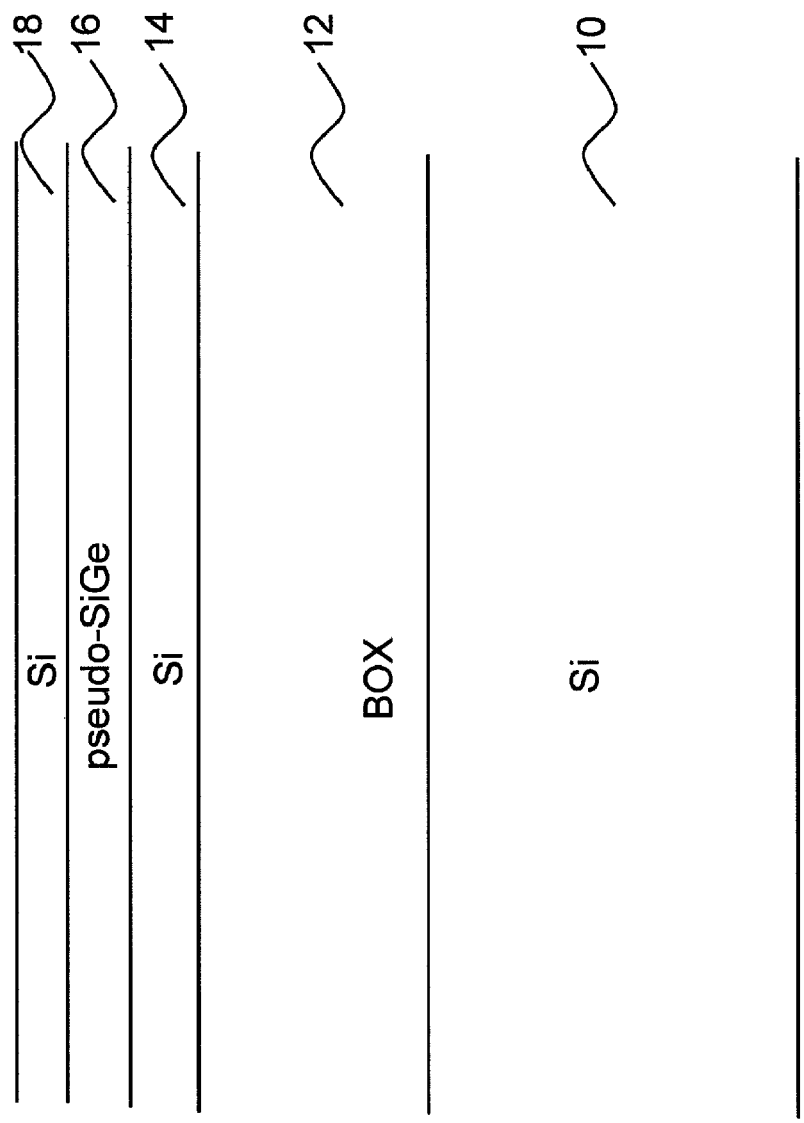
FIGS. 1a through 1i represent a fabrication process to form a device in accordance with the invention.

FIGS. 1a through 1i represent a fabrication process to form a device according to the invention. In FIG. 1a, a substrate including for example a silicon-on-insulator (SOI) layer 10 or the like is provided. An optional buried oxide layer (BOX) 12 may also be formed on the SOI 10 with a silicon layer 14 on the BOX 12. FIG. 1a further shows a pseudomorphic SiGe layer 16 epitaxially grown on the silicon layer 14, followed by another epitaxial silicon layer 18.

In embodiments, the thicknesses of the layers are in various ranges. For example, the BOX 12 may be between 1200 Å and 1600 Å, and the silicon layer 14 may be between 10 Å and 1000 Å, preferably 700 Å in thickness. Additionally, the SiGe layer 16 may be between 50 Å and 500 Å, 90 Å and 500 Å and preferably 400 Å. It should be understood, though, that the thickness of these layers can vary, depending on the various design parameters of the device.

In implementation, the pseudomorphic SiGe layer 16 is epitaxially grown in a conventional manner. The Ge content may be greater than 0% in ratio to the Si content, with a range of between 20% to 30% being contemplated by the invention. The silicon layer 18 on the pseudomorphic SiGe layer 16 can be deposited in a conventional manner via any selective epitaxial silicon formation technique, for example rapid thermal chemical vapor deposition (RTCVD) or molecular beam epitaxy (MBE) may be used to epitaxially grow device quality silicon.

Figure 1B:
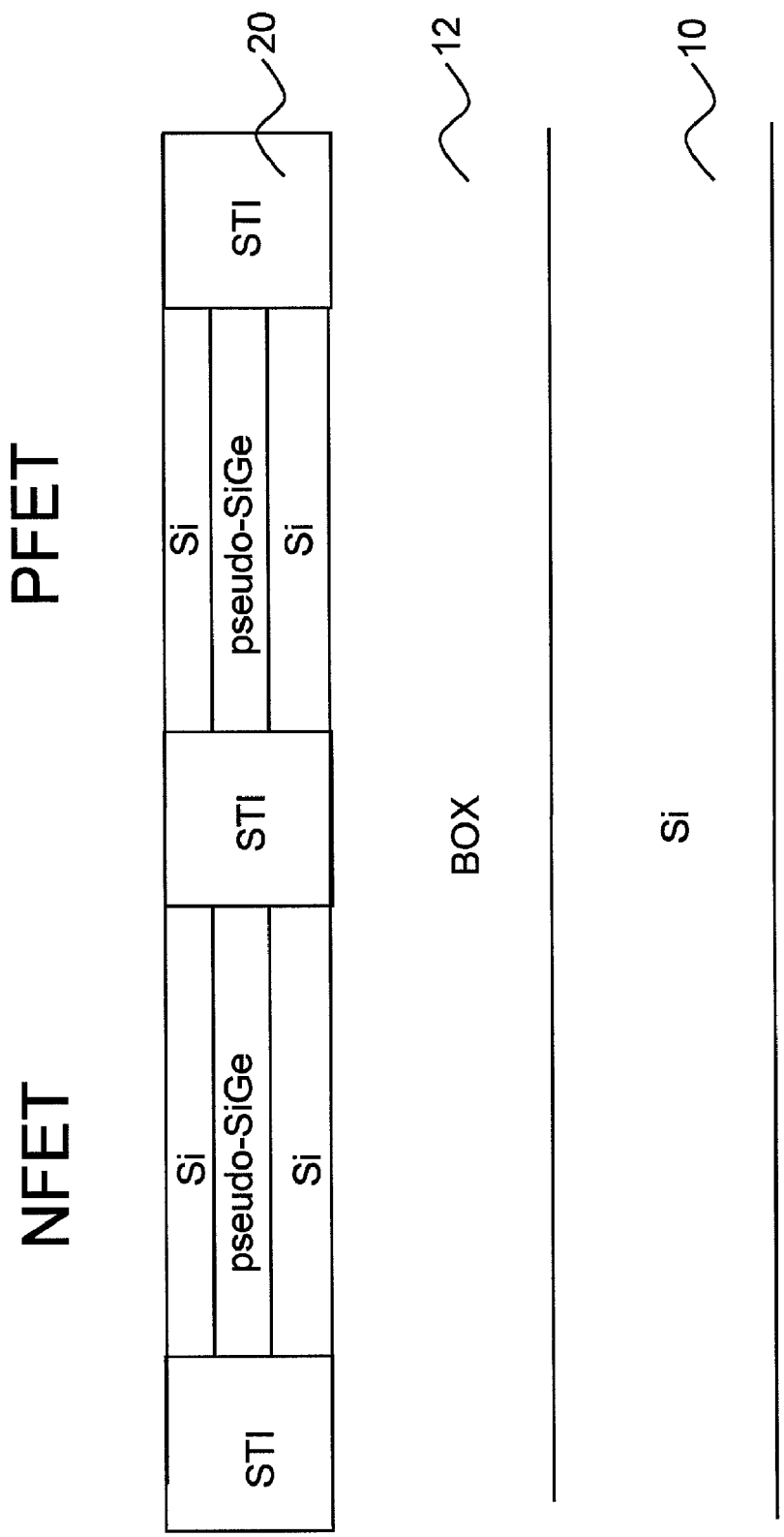

FIG. 1b shows the separated channels (or device regions) formed by shallow trench isolation (STI) 20. The insulating trenches 20 are formed by conventional patterning processes including lithography and etching steps. For example, the stacked layers 14, 16, 18 are patterned to form STIs 20 using standard techniques of pad oxidation, pad nitride deposition, lithography based patterning, reactive ion etching (RIE) of the stacked layers, to the buried oxide. A liner deposition, fill deposition, and chemical mechanical polish, for example, can then be used to form the STI 20. The STI formation process is well known in the art.

Figure 1C:
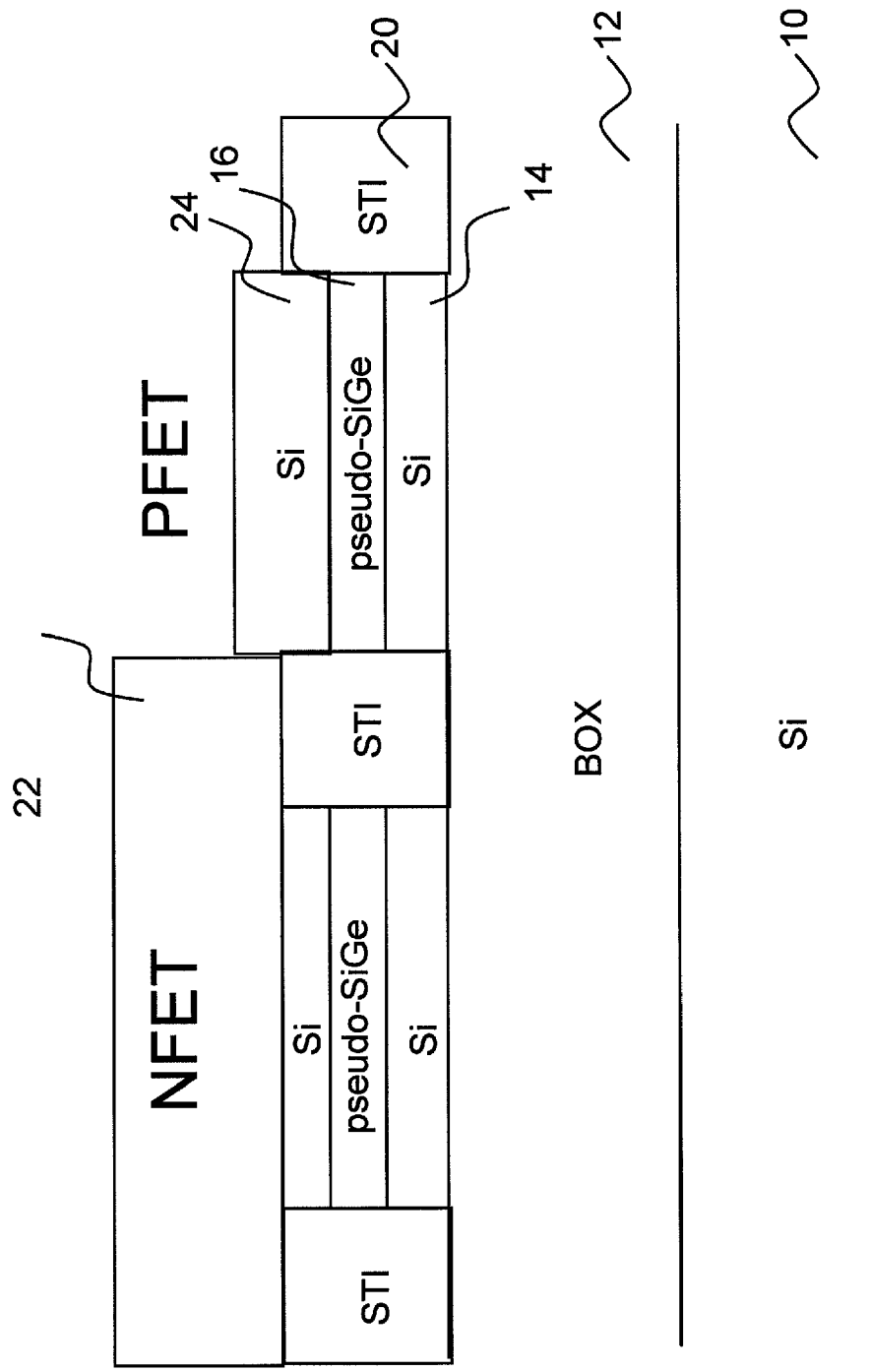

FIG. 1c depicts a modification to the Si layer 16 of the PFET stack. In this process, a mask 22 is placed over the NFET region. Epitaxial Si is selectively grown on the Si layer 18 in the PFET region, resulting in a seamless new Si layer 24. The newly formed layer 24 is allowed to differ in its thickness compared to the top Si layer 16 in the NFET region. Preferably, the Si layer 24 is thicker than the Si layer 16 of the NFET region, with a range for the Si layer 24 being between 200 Å and 600 Å, with a delta of at least 100 Å between NFET Si layer 18 and PFET Si layer 24.

Figure 1D:
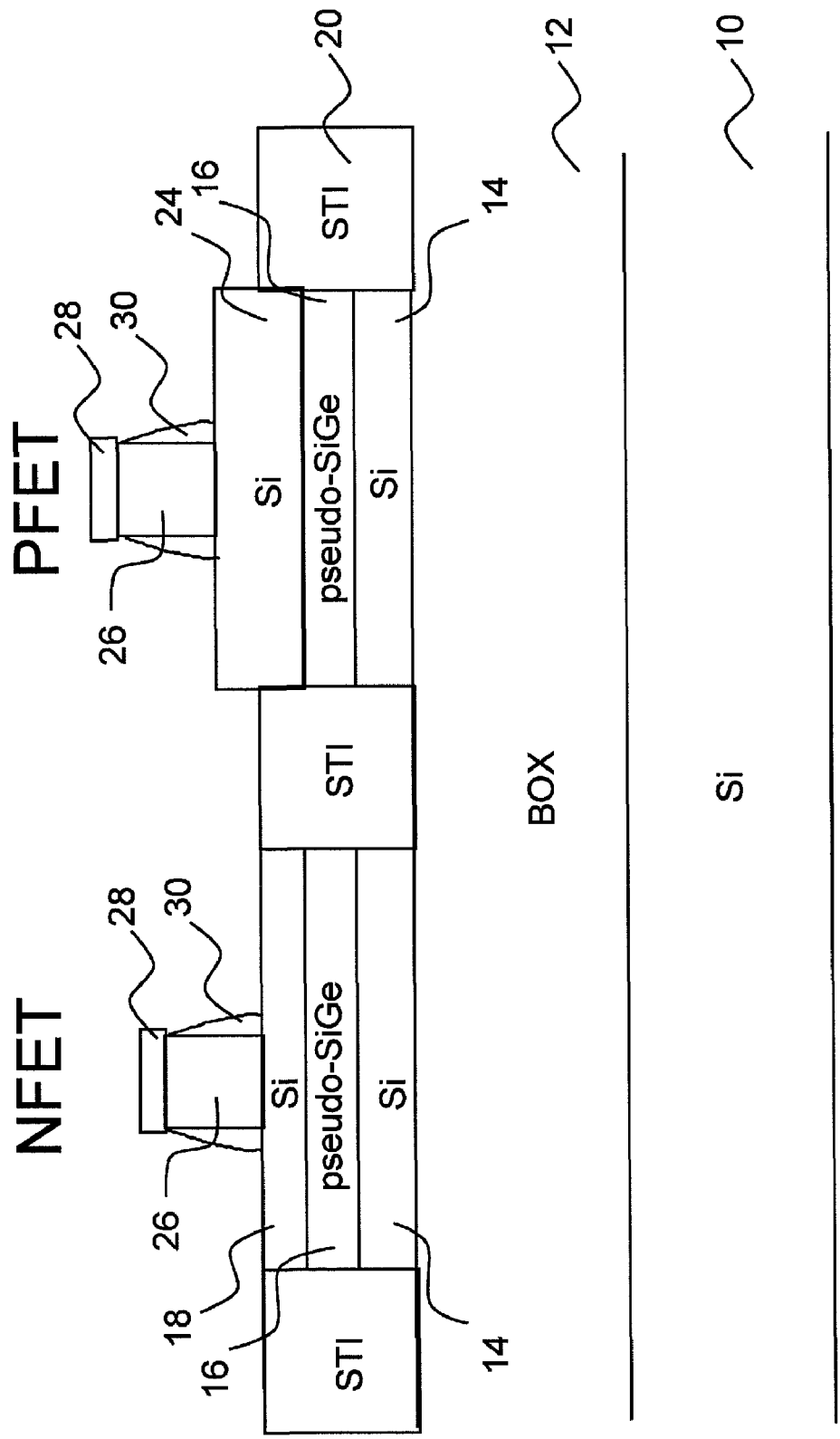

FIGS. 1d through 1i show the fabrication process of the gate structures, including the source and drain (S/D) regions for the NFET and PFET channel, respectively. Referring to FIG. 1d, SiN capped (28) polysilicon gates 26 are patterned in both the NFET and PFET region by conventional patterning processes, which include lithography and etching steps. By way of example, a polysilicon layer capped with a SiN 28 protection layer is formed on the structure. A lithography process is applied with entails applying a photoresist on the SiN capped polysilicon layer, exposing the photoresist to a pattern of radiation, and developing the pattern utilizing a conventional resist developer. Following the lithography step, a conventional etching process such as RIE, plasma etching, ion beam etching, or laser ablation may be employed in transferring the pattern to active areas of the NFET region and PFET region to form polysilicon gates 26. Sidewall spacers 30 are then formed, which will act as an etching stop material. The cap 28 and the polysilicon sidewall spacer 30 are also formed in a conventional manner. In this processing, a sacrificial block material is deposited on the structure. In one embodiment, the sacrificial material is a nitride material (e.g., $Si_3N_4$), which forms the SiN elements 28 and 30. The layers 28, 30 can be formed in a conventional manner, such as by chemical vapor deposition (CVD) using a silane source. Other techniques which may be suitable for forming a nitride layer include LPCVD, and atmospheric pressure CVD (APCVD). The size of the polysilicon gate 26 and its two sidewall spacers 30, which cover the underlying layers 16 and 24 in the NFET and PFET region, respectively, ranges from 400 Å to 1000 Å, whereby the spacers have a preferred size of 100 Å, leaving the size of the gate 26 in a range of 200 Å and 800 Å, preferably 400 Å for both the NFET and PFET region. It should be understood that this is applicable for gate lengths centered around a nominal value (smallest size of the technology). For example, 400 Å is a reasonable gate length for 65 nm technology.

Figure 1E:
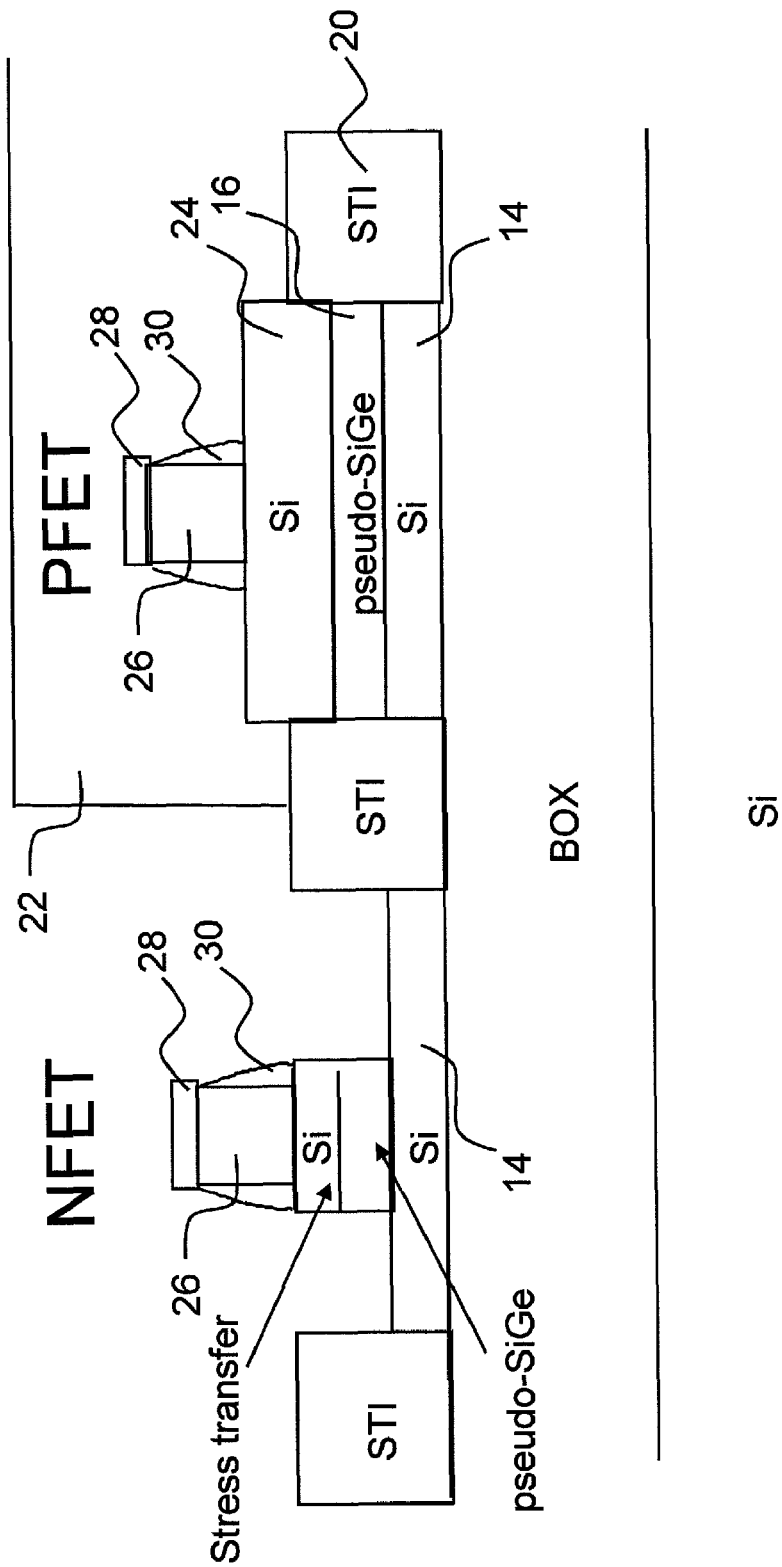

Referring to FIG. 1e, a hard mask 22 is placed onto the PFET region prior to the preparation of the S/D trenches in the NFET channel. The regions in the NFET adjacent to the stack formed by layers 16, 18, 28, and 30 are etched down ideally to the silicon layer 14, although some overetch is tolerable. This etching causes elastic relaxation at the edges of the SiGe layer, resulting in tensile strain placed on the upper Si layer.

Figure 1F:
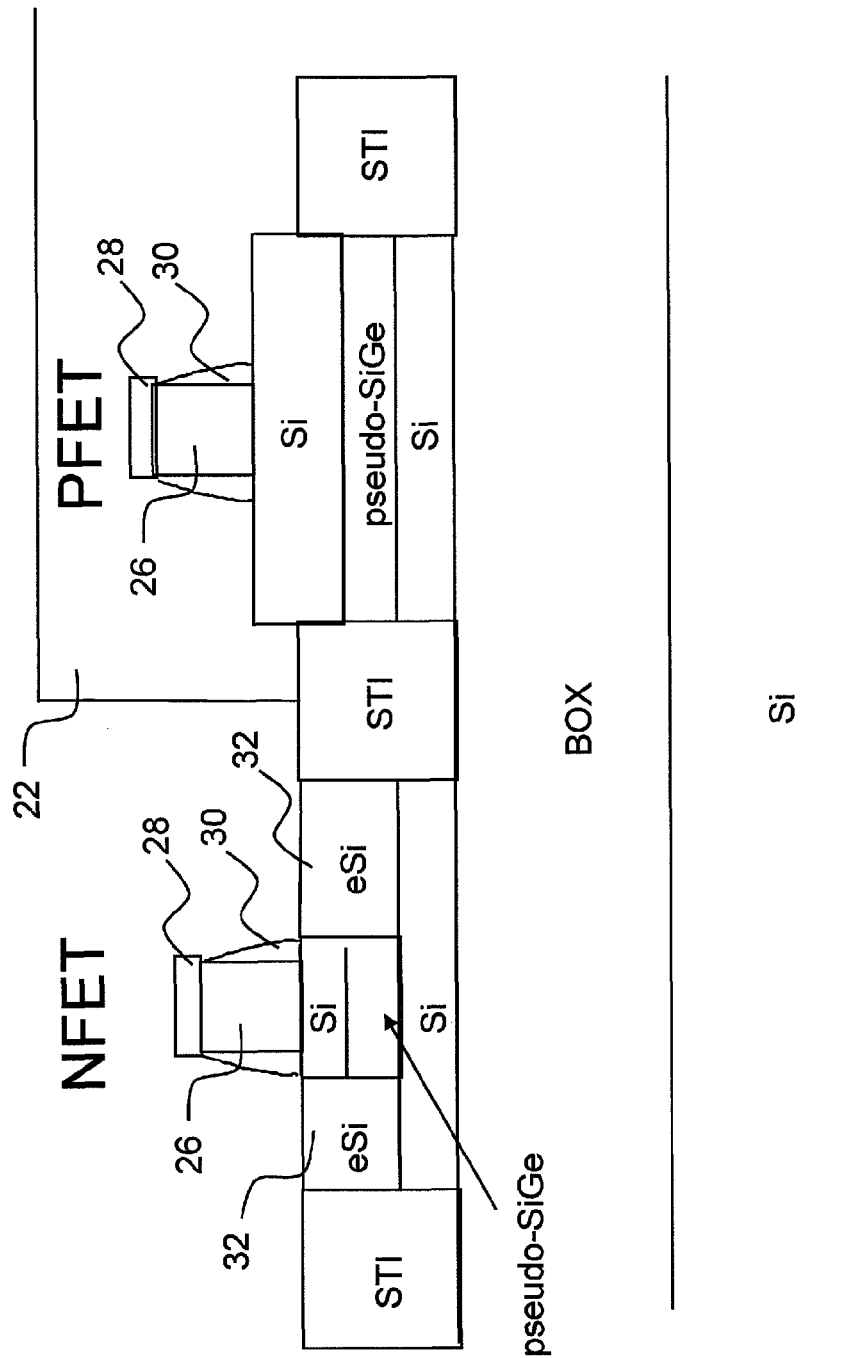

FIG. 1f depicts the device after epitaxial silicon 32 is selectively grown in the S/D trenches between the gate island formed by the SiGe and Si layers. In view of the above described dimensions, the resulting gate island results in a longitudinal size between 500 Å and 1000 Å, preferably 800 Å. The pseudomorphic SiGe layer 16 within the gate island in the NFET region exercises a tensile stress onto the epitaxially grown silicon 18 in the channel region resulting in improved NFET device characteristics.

Figure 1G:
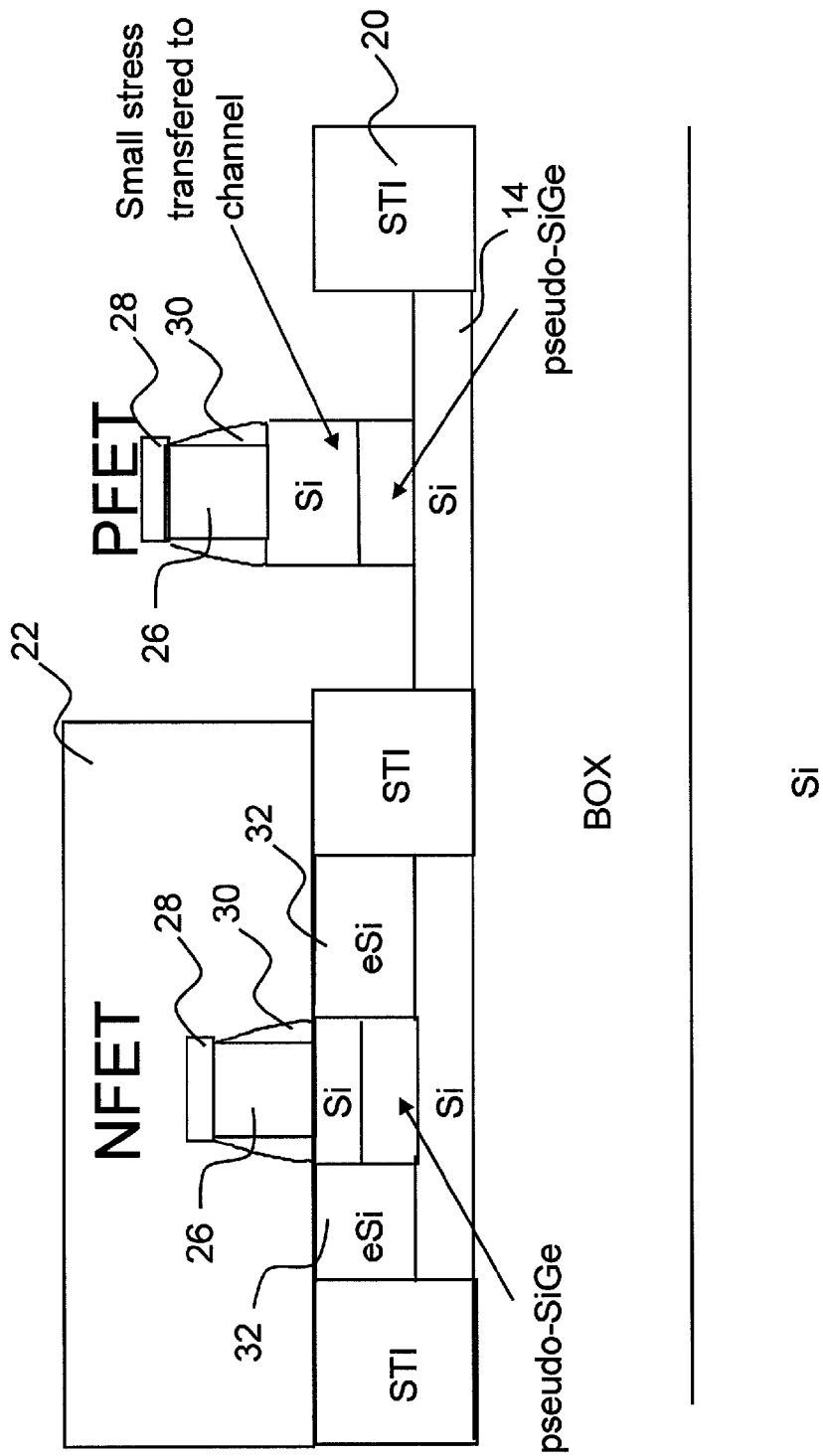

FIG. 1g—analogous to FIG. 1d—presents the S/D preparation of the PFET region. In this processing step, a protective hard mask 22 is placed over the NFET region and the S/D trenches adjacent to the stack formed by layers 16, 24, 26, 28, and 30 are etched down ideally to Si layer 14. Since the upper Si layer, over the SiGe layer, is thicker than that of the Si layer of the NFET region, much less tensile stress is imparted on the Si channel of the PFET region.

Figure 1H:
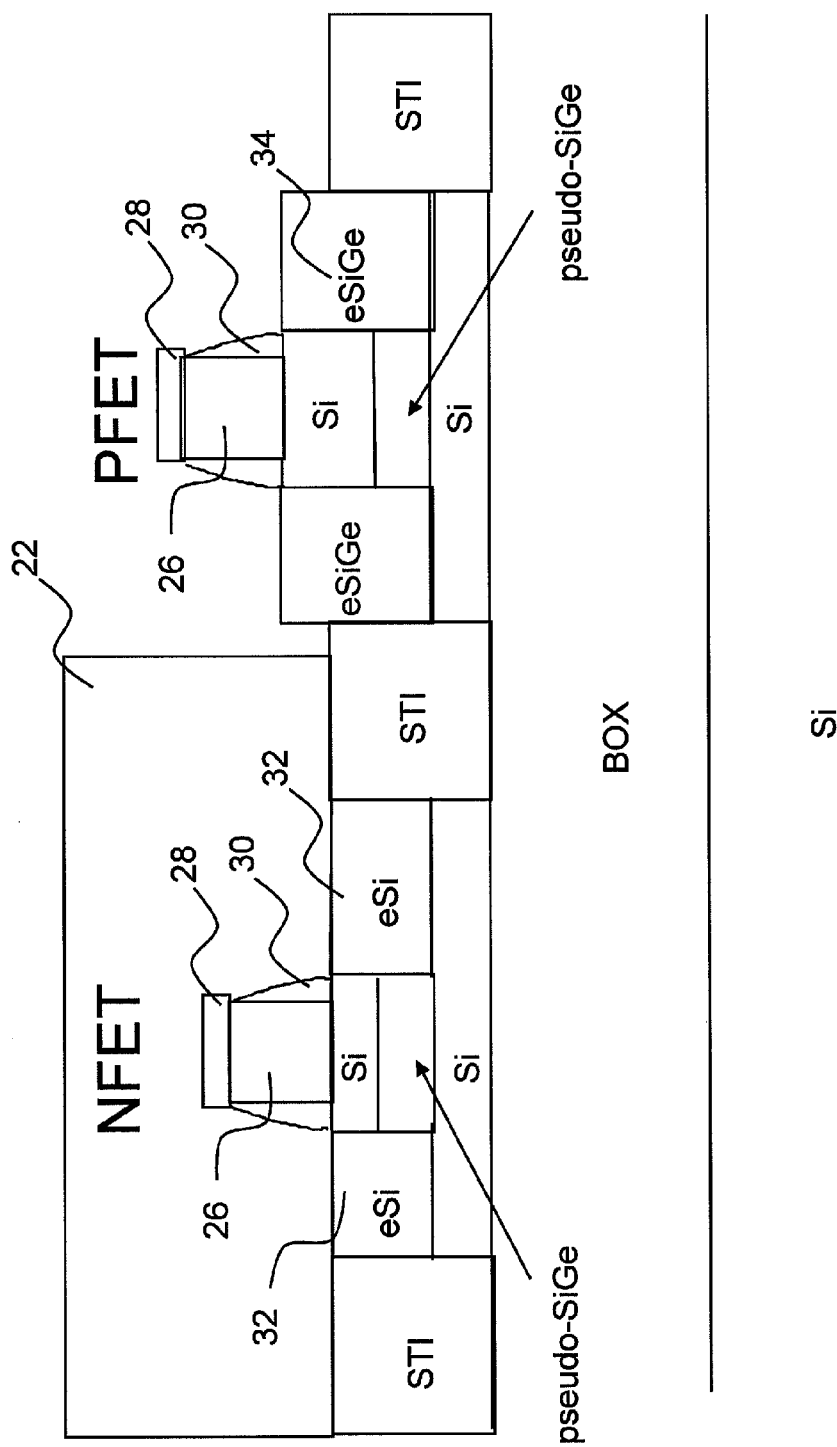

FIG. 1h depicts the filled S/D trenches of the PFET device. In contrast to the NFET region, these trenches are filled with SiGe 34, which is grown epitaxially and, in one embodiment, substantially flush with layer 24. The longitudinal dimensions of these elements are similar to those described above for the NFET region. The PFET gate island formed by layers 16 and 24 have a resulting size of 500 Å to 1000 Å, preferably 800 Å. The SiGe material 34 induces a compressive stress on the Si channel of the PFET device, resulting in improved PFET device characteristics.

Figure 1I:
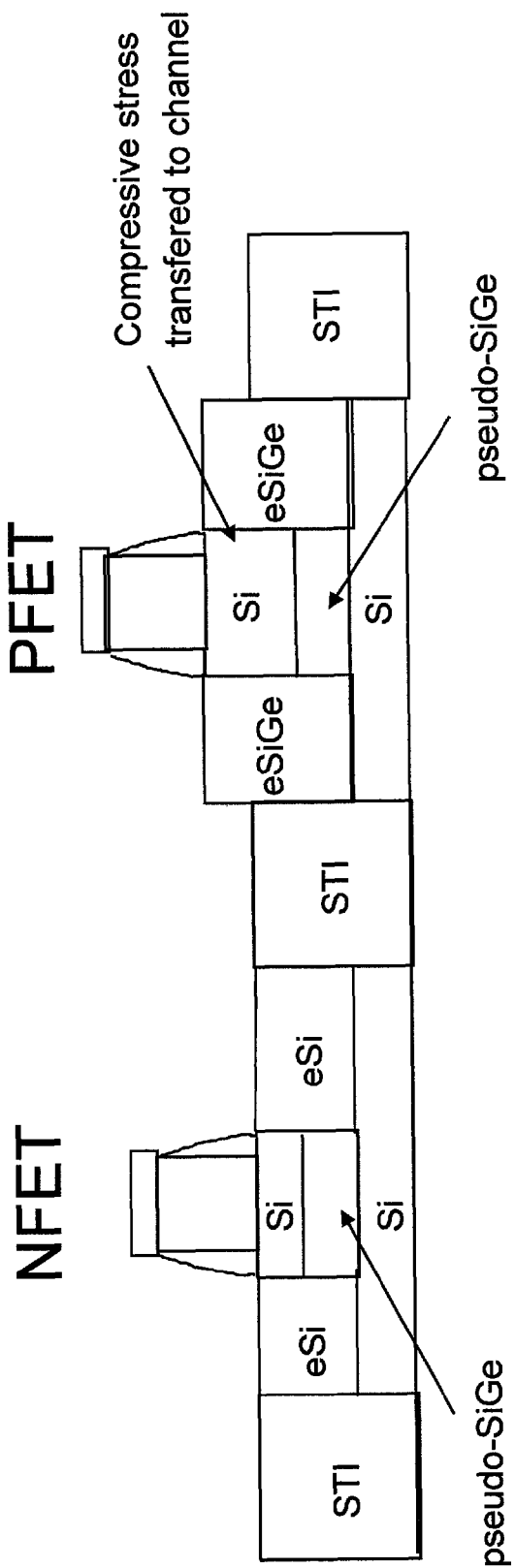

FIG. 1i shows the fabricated CMOS device. The ratio of the eSiGe material 34 can vary between any germanium above 0% with respect to the total amount of silicon and germanium in the trench.

Figure 2B:
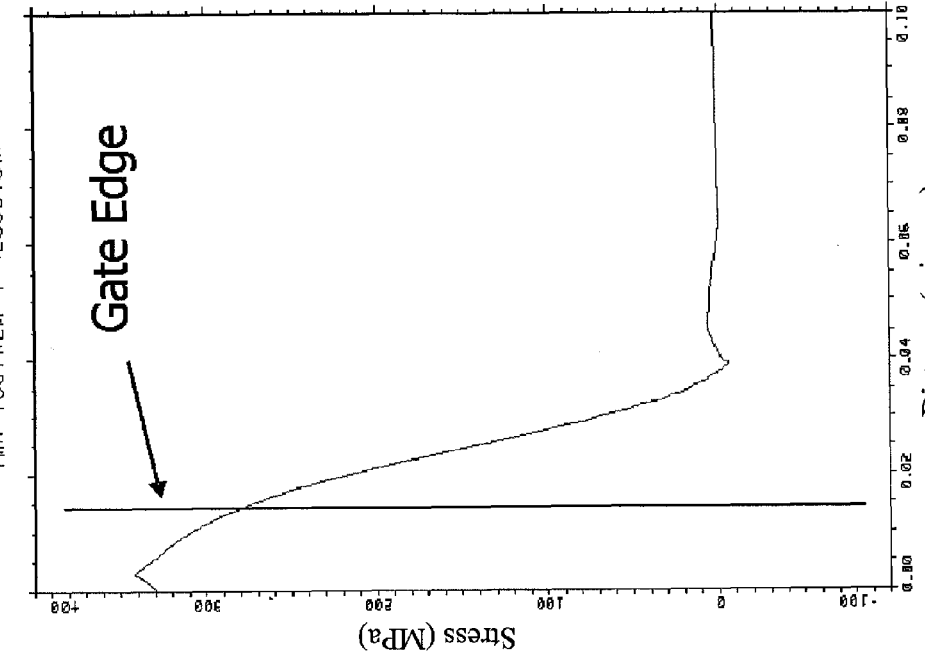
FIG. 2b shows a graph of stress as a function of longitudinal distance to the center of the gate of the NFET device in accordance with the invention.
Figure 2A:
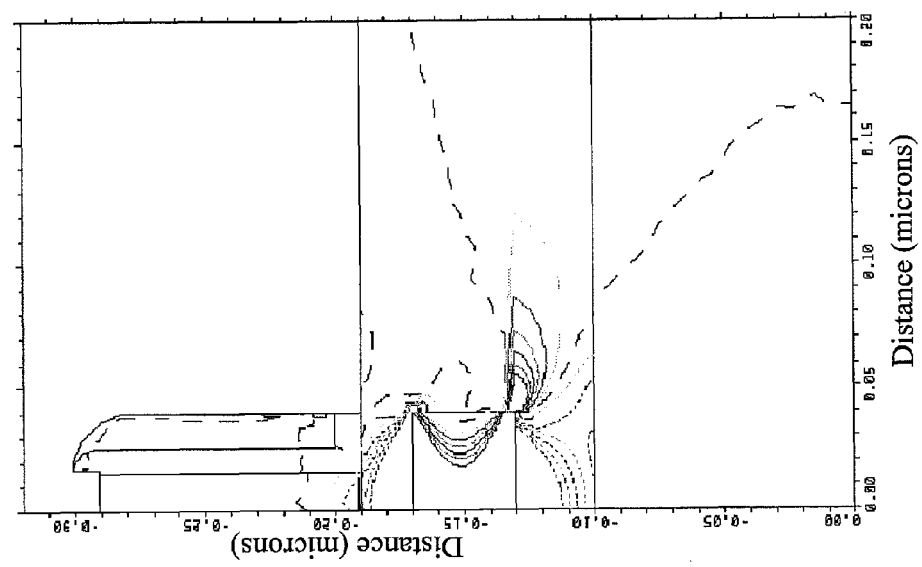
FIG. 2a illustrates a location of stress in a NFET device according to the invention.

FIG. 2a illustrates the locations of the stresses in an NFET device according to the invention. As shown in FIG. 2a, tensile stresses are present in the channel of the NFET with a region of unrelaxed SiGe under compression. More specifically, in the structure of the invention, the lattice structure of the SiGe layer 16 matches the lattice structure of the underlying Si layer 14. This results in the SiGe layer 16 and the surrounding areas being under a compressive stress. Upon etching the S/D trenches (or wells), the edges of the SiGe layer will undergo elastic relaxation, resulting in a tensile stress on the Si layer 18 in the channel.

FIG. 2b illustrates the course of stress as a function of longitudinal distance to the center of the gate of the NFET device. For a Ge content of 20% and a thickness of Si layer 18 of 200 Å, the current invention provides tensile stresses in the range of 300 MPa. In one implementation, the preferred range of the longitudinal stress component (stress in direction of current flow from source to drain) in the Si layer 18, is preferred to be greater than 100 MPa. FIG. 2b also shows that the tensile stresses extent laterally into the epitaxially grown Si elements 32 and tensile stresses above 100 MPa reaches up to 150 Å into element 32 and reaches relaxation (no stress induction) at 250 Å from the edge of the gate.

Figure 3:
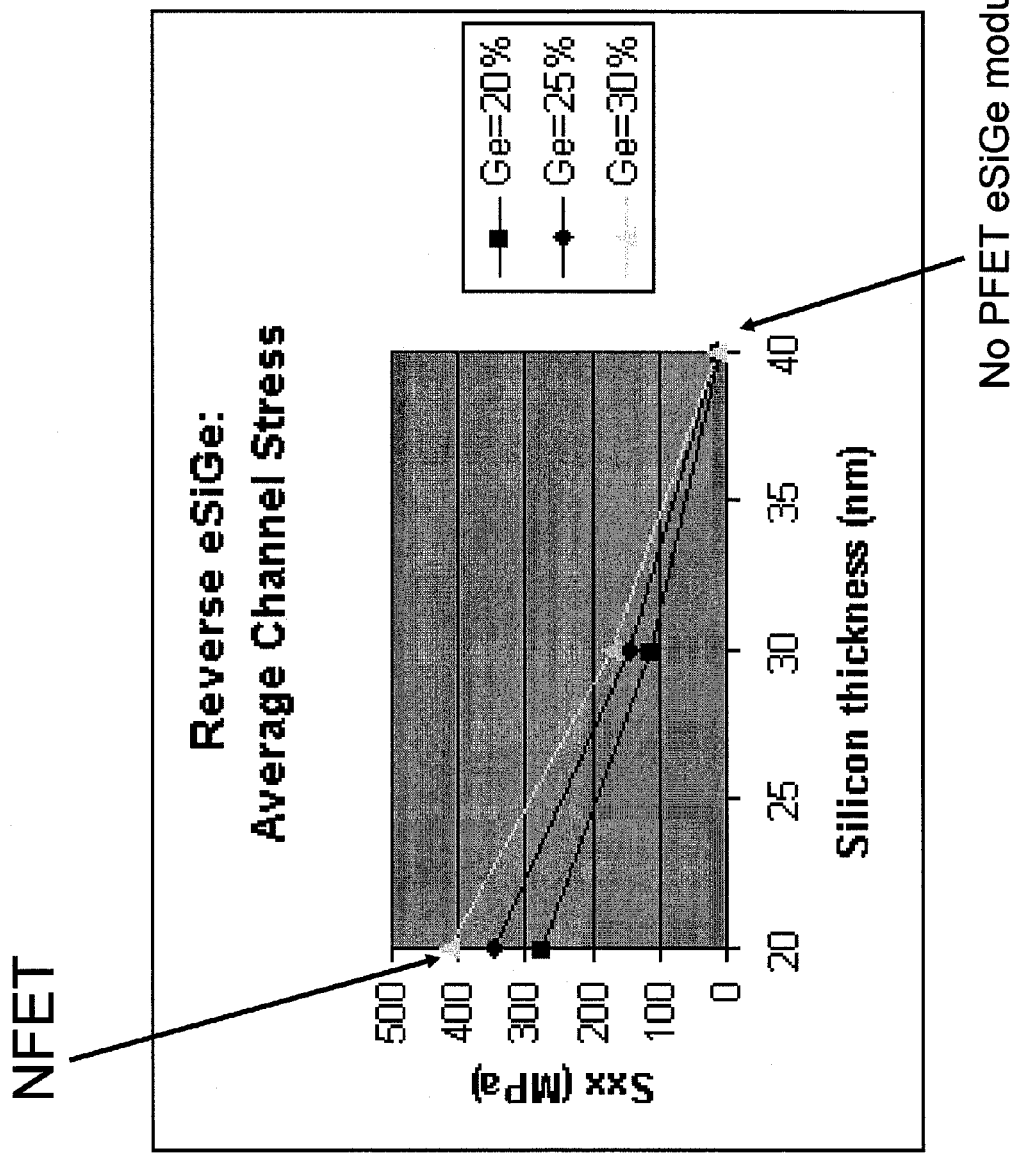
FIG. 3 illustrates and compares the Average Channel Stress as function of the thickness of the Silicon layer above the stress inducing layer, e.g., a pseudo SiGe layer in accordance with the invention.

FIG. 3 show the course of stress in the longitudinal direction of the above lying silicon layers 18 and 24. As shown in this graph, the Ge content of the SiGe layer ranged from 20% to 30%. The thickness of the upper Si layer in the NFET ranged from about 200 Å to 400 Å. Interestingly, high stresses (above 200 MPa) are obtained into the Si layer up to 200 Å and range between approximately 275 MPa and 415 MPa depending on the Ge content of layer 16, then relaxing into a substantially strainless region when the silicon layer becomes 400 Å thick. According, it is preferable for the Si layer, overlying the SiGe layer in the PFET to be 400 Å or thicker.

Thus, in the structure of the invention, tensile stresses are now formed in the channel of NFET and compressive stresses are formed in the PFET. By allowing such stresses, high device performance can be achieved. In addition, with the processes of the invention, the manufacturing costs can be reduced while resulting higher yields.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A method of manufacturing a semiconductor structure, comprising:
    forming a stress inducing layer on a substrate in an NFET region and a PFET region;
    forming a top layer over the stress inducing layer in the NFET region and the PFET region, the top layer being of a different thickness in the NFET region and the PFET region;
    etching trenches into sides of the PFET region and the NFET region, the etching of the trenches creating a tensile stress in the NFET region and a reduced tensile stress in the PFET region; and
    filing the trenches with a first material for the NFET region and a second material for the PFET region, the second material creating a compressive stress in the PFET region.

2. The method of claim 1, wherein the top layer of the PFET region is formed by depositing or growing more material on the PFET region, forming a thicker top layer in the PFET region, while protecting the NFET region.

3. The method of claim 2, wherein the thicker top layer in the PFET region is of a same material as the top layer in the NFET region, the thicker layer in the PFET region substantially reduces the stress in the channel imposed by the stress inducing layer upon etching of the trenches in the PFET region.

4. The method of claim 1, wherein the stress inducing material and the second material is a silicon germanium composite.

5. The method of claim 4, wherein the tip layer and the first material is silicon.

6. The method of claim 1, wherein a thickness of the top layer differ in the range of 50 to 500 Å.

7. The method of claim 1, wherein the second material is a silicon germanium composite.

8. A semiconductor structure comprising a PFET device and an NFET device, the PFET device and the NFET device having a layered structure of the same materials in the channel region, a top layer of the same materials in the PFET channel region is thicker than a top layer of the NFET channel region, and trenches of the PFET channel region and the NFET channel region are different, wherein the top layer in the PFET channel region reduces a tensile stress generated by a stress inducing underlying layer upon trench etching, compared to that of the NFET channel region.

9. The structure of claim 8, wherein stress inducing layer and the trenches of the PFET channel region is a silicon germanium composite.

10. A semiconductor structure, comprising:
    a layered structure with an underlying stress inducing material, in a P-type field-effect-transistor (PFET) channel region and a n-type field effect-transistor (NFET) channel region formed simultaneously;
    a layer over the underlying stress inducing material of the PFET channel region while protecting the NFET channel region;
    an island in the NFET channel region and the PFET channel region, creating a higher resultant stress component in the NFET channel region; and
    a stress inducing material in etched portions of the PFET channel region creating an opposite stress component in the PFET channel region than in the NFET channel region.

11. The structure of claim 10, wherein the layered structured with an underlying stress inducing material includes a top layer of Si and an underlying layer of SiGe, wherein the top layer of Si is of a different thickness respective to the NFET or PFET channel regions.

12. The structure of claim 10, wherein the PFET channel region is thicker than the NFET channel region.

13. The structure of claim 10, wherein the PFET channel region has a top layer thicker than the NFET channel region.

14. The structure of claim 10, wherein the layered structure with an underlying stress inducing material includes a top layer of Si and an underlying layer of SiGe, wherein the top layer of Si in the PFET channel region is thicker than the top layer of Si in the NFET channel region.

15. The structure of claim 14, wherein the germanium content of the SiGe is approximate from 20% and 30%.

16. The structure of claim 14, wherein a thickness of the top layer of Si in the PFET channel region is approximately 400 Å.

17. The structure of claim 10, wherein the PFET channel region includes an Si layer having a thickness which substantially reduces tensile stress in the PFET channel region.

18. The structure of claim 17, wherein the stress inducing material in the etched portions of the PFET channel region provide compressive forces in the PFET channel region.

* * * * *